United States Patent
Chakravorty et al.

(10) Patent No.: US 6,775,150 B1
(45) Date of Patent: Aug. 10, 2004

(54) ELECTRONIC ASSEMBLY COMPRISING CERAMIC/ORGANIC HYBRID SUBSTRATE WITH EMBEDDED CAPACITORS AND METHODS OF MANUFACTURE

(75) Inventors: Kishore K. Chakravorty, San Jose, CA (US); Paul H. Wermer, San Francisco, CA (US); David G. Figueroa, Mesa, AZ (US); Debabrata Gupta, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 09/650,566

(22) Filed: Aug. 30, 2000

(51) Int. Cl.[7] ................................................ H05K 1/18
(52) U.S. Cl. ........................................ 361/761; 174/254
(58) Field of Search ................................ 361/761, 760, 361/803, 807, 811, 763, 306.1–306.3; 174/75 R, 35 MS, 254

(56) References Cited

U.S. PATENT DOCUMENTS

| | | | |
|---|---|---|---|
| 4,567,542 A | | 1/1986 | Shimada et al. ............ 361/321 |
| 4,926,241 A | * | 5/1990 | Carey |
| 5,027,253 A | | 6/1991 | Lauffer et al. ............. 361/321 |
| 5,060,116 A | * | 10/1991 | Grobman et al. |
| 5,177,594 A | | 1/1993 | Chance et al. ............. 257/678 |
| 5,177,670 A | * | 1/1993 | Shinohara et al. .......... 361/738 |
| 5,281,151 A | * | 1/1994 | Arima et al. ............... 439/68 |
| 5,321,583 A | | 6/1994 | McMahon ................. 361/770 |
| 5,354,955 A | * | 10/1994 | Gregor et al. |
| 5,377,139 A | | 12/1994 | Lage et al. ................. 365/154 |
| 5,469,324 A | | 11/1995 | Henderson et al. ....... 361/301.2 |
| 5,488,542 A | | 1/1996 | Ito ............................. 361/793 |
| 5,639,989 A | * | 6/1997 | Higgins, III |
| 5,691,568 A | | 11/1997 | Chou et al. ................ 257/691 |
| 5,714,801 A | | 2/1998 | Yano et al. ................ 257/691 |
| 5,736,448 A | * | 4/1998 | Saia et al. .................. 438/393 |
| 5,745,335 A | | 4/1998 | Watt .......................... 361/313 |

(List continued on next page.)

FOREIGN PATENT DOCUMENTS

| | | | |
|---|---|---|---|
| EP | 0359513 | 3/1990 | ........... H01L/23/64 |
| EP | 0656658 | 6/1995 | ......... H01L/25/065 |

(List continued on next page.)

OTHER PUBLICATIONS

Amey, D., et al., "Advances in MCM Ceramics", *Solid State Technology*, 143–146, (1997).

Baniecki, J., et al., "Dielectric Relaxation of Ba0.7 Sr0.3 TiO3 Thin Films from 1 mHz to 20 GHz", *Appl. Phys. Letter 72(4)*, 1998 American Institute of Physics, 198–500, (Jan. 1998).

(List continued on next page.)

*Primary Examiner*—David Martin
*Assistant Examiner*—Thanh S. Phan
(74) *Attorney, Agent, or Firm*—Schwegman, Lundberg, Woessner & Kluth, P.A.

(57) ABSTRACT

To reduce switching noise, the power supply terminals of an integrated circuit die are coupled to the respective terminals of at least one embedded capacitor in a multilayer ceramic/organic hybrid substrate. In one embodiment, a ceramic portion of the substrate includes at least one capacitor formed of a high permittivity layer sandwiched between conductive planes. An organic portion of the substrate includes suitable routing and fan-out of power and signal conductors. The organic portion includes a build-up of multiple layers of organic material overlying the ceramic portion. Also described are an electronic system, a data processing system, and various methods of manufacture.

33 Claims, 5 Drawing Sheets

U.S. PATENT DOCUMENTS

| | | | |
|---|---|---|---|
| 5,777,345 A | | 7/1998 | Loder et al. ................. 257/777 |
| 5,786,630 A | | 7/1998 | Bhansali et al. ............ 257/697 |
| 5,796,587 A | | 8/1998 | Lauffer et al. .............. 361/763 |
| 5,818,699 A | * | 10/1998 | Fukuoka |
| 5,840,382 A | | 11/1998 | Nishide et al. ............. 428/209 |
| 5,870,274 A | | 2/1999 | Lucas ......................... 361/311 |
| 5,870,289 A | | 2/1999 | Tokuda et al. .............. 361/779 |
| 5,889,652 A | | 3/1999 | Turturro ..................... 361/705 |
| 5,920,120 A | | 7/1999 | Webb et al. ................. 257/719 |
| 5,929,510 A | | 7/1999 | Geller et al. ................ 257/635 |
| 5,939,782 A | | 8/1999 | Malladi ...................... 257/698 |
| 5,949,654 A | * | 9/1999 | Fukuoka |
| 5,991,161 A | | 11/1999 | Samaras et al. ............ 361/760 |
| 6,061,228 A | | 5/2000 | Palmer et al. ........... 361/306.2 |
| 6,072,690 A | | 6/2000 | Farooq et al. ........... 361/321.2 |
| 6,075,427 A | | 6/2000 | Tai et al. .................... 333/219 |
| 6,088,915 A | | 7/2000 | Turturro ..................... 29/840 |
| 6,097,609 A | | 8/2000 | Kabadi ....................... 361/760 |
| 6,097,611 A | | 8/2000 | Samaras et al. ............ 361/760 |
| 6,104,599 A | * | 8/2000 | Ahiko et al. ............ 361/306.3 |
| 6,183,669 B1 | | 2/2001 | Kubota et al. ........... 252/518.1 |
| 6,218,729 B1 | | 4/2001 | Zavrel, Jr. et al. .......... 257/698 |
| 6,252,761 B1 | * | 6/2001 | Branchevsky ............ 361/321.2 |
| 6,452,776 B1 | * | 9/2002 | Chakravorty ................ 361/303 |
| 6,532,143 B2 | * | 3/2003 | Figueroa et al. .......... 361/301.4 |

FOREIGN PATENT DOCUMENTS

| | | | | |
|---|---|---|---|---|
| JP | | 07-142867 | 6/1995 | ............ H05K/3/46 |
| JP | | 08-172274 | 7/1996 | ............ H05K/3/46 |
| JP | | 10-163447 | 6/1998 | ......... H01L/27/108 |
| WO | | WO 97/50123 | 12/1997 | .......... H01I/23/053 |
| WO | | WO 98/39784 | 9/1998 | ............ H01G/4/06 |
| WO | | WO 00/21133 | 4/2000 | ......... H01L/23/538 |
| WO | | WO-01/00573 | 1/2001 | ......... C07C/311/16 |

OTHER PUBLICATIONS

Chan, Y., et al., "Fabrication and Characterization of Multilayer Capacitors Buried in a Low Temperature Co–Fired Ceramic Substrate", *Active and Passive Elec. Comp. vol. 20*, 215–224, (1998).

Choi, K.L., et al., "Characterization of Embedded Passives Using Macromodels in LTCC Technology", *IEEE Transactions on Components, Packaging, and Manufacturing Technology, vol. 21*, 258–268, (Aug. 1998).

Eurskens, W., et al., "Design and Performance of UHF Band Inductors, Capacitors and Resonators Using LTCC Technology for Mobile Communication Systems", *1998 IEEE MTT–S Digest*, 1285–1288, (1998).

Koschmieder, T., et al., "Ceramic Substrate Thickness, Test Board Thickness, and Part Spacing: A Screening Doe", *Proceedings of SMTA International Conference*, 6 pgs., (Sep. 1999).

Mistler, R.E., "Tape Casting: Past, Present, Potential", *The American Ceramic Society Bulletin*, 82–86, (Oct. 1998).

Nishimura, T., et al., "3.5 V Operation Driver–Amplifier MMIC Utilizing SrTiO3 Capacitors for 1.95 GHz Wide–Band CDMA Cellular Phones", *1998 IEEE MTT–S Digest*, 447–450, (1998).

Rector, Jr., J., et al., "Integrated and Integral Passive Components: A Technology Roadmap", *1997 Electronic Components and Technology Conference*, 713–723, (1997).

Scrantom, S., et al., "Manufacture of Embedded Integrated Passive Components into Low Temperature Co–Fired Ceramic Systems", *1998 International Symposium on Microelectronics*, 459–466, (1998).

Sugai, K., et al., "Multilayer Alumina Substrates for ECU", *1998 IEEE/CPMT Berlin Int'l Electronics Manufacturing Technology Symposium*, 109–112, (1998).

Tok, A.I., et al., "Tape Casting of Composite Ceramic Substrates Using Hollow Micro–Speherical Powders", *Processing and Fabrication of Advanced Materials VII*, Proceedings of a Symposium organized by: The Minerals, Metals & Materials Society (TMS), Warrendale, PA, USA, 451–461, (Oct. 1998).

Ueda, T., et al., "GaAs MMIC Chip–sets for Mobile Communication Systems with On–chip Ferroelectric Capacitors", *Integrated Ferroelectrics, vol. 7*, 45–60, (1995).

Williamson, III, W., et al., "High Frequency Dielectric Properties of PLZT Thin Films", *Integrated Ferroelectrics, vol. 17*, 197–203, (1997).

Yamasaki, K., et al., "Solder Column Interposer Grid Array—Improved CBGA Reliability", 1–9.

Yao, K., et al., "Improved Preparation Procedure and Properties for a Multilayer Piezoelectric Thick–Film Actuator", *Sensors and Actuators A 71*, 139–143, (1998).

* cited by examiner

US 6,775,150 B1

ELECTRONIC ASSEMBLY COMPRISING CERAMIC/ORGANIC HYBRID SUBSTRATE WITH EMBEDDED CAPACITORS AND METHODS OF MANUFACTURE

RELATED APPLICATIONS

The present application is related to the following applications which are assigned to the same assignee as the present application:

Ser. No. 09/631,037 entitled "Electronic Assembly Comprising Substrate with Embedded Capacitors"; and Ser. No. 09/628,705 entitled "Electronic Assembly Comprising Interposer with Embedded Capacitors and Methods of Manufacture".

TECHNICAL FIELD

The present subject matter relates generally to electronics packaging. More particularly, the present subject matter relates to an electronic assembly that includes a ceramic/organic hybrid substrate having one or move embedded capacitors to reduce switching noise in a high speed intergrated circuit, and to manufacture methods related thereto.

BACKGROUND INFORMATION

Integrated circuits (ICs) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates, where each new generation of packaging must provide increased performance while generally being smaller or more compact in size.

An IC substrate may comprise a number of insulated metal layers selectively patterned to provide metal interconnect lines (referred to herein as "traces"), and one or more electronic components mounted on one or more surfaces of the substrate. The electronic component or components are functionally connected to other elements of an electronic system through a hierarchy of conductive paths that includes the substrate traces. The substrate traces typically carry signals that are transmitted between the electronic components, such as ICs, of the system. Some ICs have a relatively large number of input/output (I/O) terminals, as well as a large number of power and ground terminals. The large number of I/O, power, and ground terminals requires that the substrate contain a relatively large number of traces. Some substrates require multiple layers of traces to accommodate all of the system interconnections.

Traces located within different layers can be connected electrically by vias formed in the substrate, which vias are referred to as "through-vias" if they go through substantially the entire substrate, or "blind vias" it they connect traces on only two or three layers. A via can be made by making a hole through some or all layers of a substrate and then plating the interior hole surface or filling the hole with an electrically conductive material, such as copper or tungsten.

One of the conventional methods for mounting an IC on a substrate is called "controlled collapse chip connect" (C4). In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity.

As the internal circuitry of ICs, such as processors, operates at higher and higher clock frequencies, and as ICs operate at higher and higher power levels, switching noise can increase to unacceptable levels.

For the reasons stated above, and for other reasons stated below which will become apparent to those skilled in the art upon reading and understanding the present specification, there is a significant need in the art for a method and apparatus for packaging an IC on a substrate that minimize problems, such as switching noise, associated with high clock frequencies and high power delivery.

DETAILED DESCRIPTION

In the following detailed description of embodiments of the subject matter, reference is made to the accompanying drawings which form a part hereof, and in which is shown by way of illustrations specific preferred embodiments in which the subject matter may be practiced. These embodiments are described in sufficient detail to enable those skilled in the art to practice them, and it is to be understood that other embodiments may be utilized and that logical, mechanical and electrical changes may be made without departing from the spirit and scope of the present subject matter. The following detailed description is, therefore, not to be taken in a limiting sense, and the scope of embodiment of the present subject matter is defined only by the appended claims.

The present subject matter provides a solution to power delivery problems that are associated with prior art packaging of intergrated circuits that operate at high clock speeds and high power levels by embedding one or more decoupling capacitors in a multilayer substrate. Various embodiments are illustrated and described herein. In one embodiment, an IC die or chip is directly mounted to hybrid organic/ceramic multilayer substrate, of which a ceramic portion contains one or more embedded capacitors, and of which an organic portion includes suitable routing and fan-out of power, ground, and signal conductors.

The substrate portion contains a multi-layer stack of conductive plates separated by high electric layers for forming one or more high-valued integrated capacitors. The overlying organic portion contains high density dielectric layers comprising metal interconnections. The organic layers are used for routing conductors and for transitioning from the die bump pitch on the die to the nore relaxed pitch on the opposite surface of the substrate. Because the organic portion is relatively thin, the integrated decoupling capacitors of the ceramic portion can be kept relatively close to the die, resulting in relatively low reactive inductance when the IC is operating.

In addition to the foregoing advantages, the use of a relatively rigid ceramic portion provides a desirable amount of stiffness to the package and significantly reduces the tendency of the organic/ceramic structure to bend or wrap. Also, because the coefficient of thermal expansion (CTE) of the ceramic portion is close to that of the die, the use of the ceramic portion helps minimize thermal-induced mechanical stress in the die.

Figure 1:
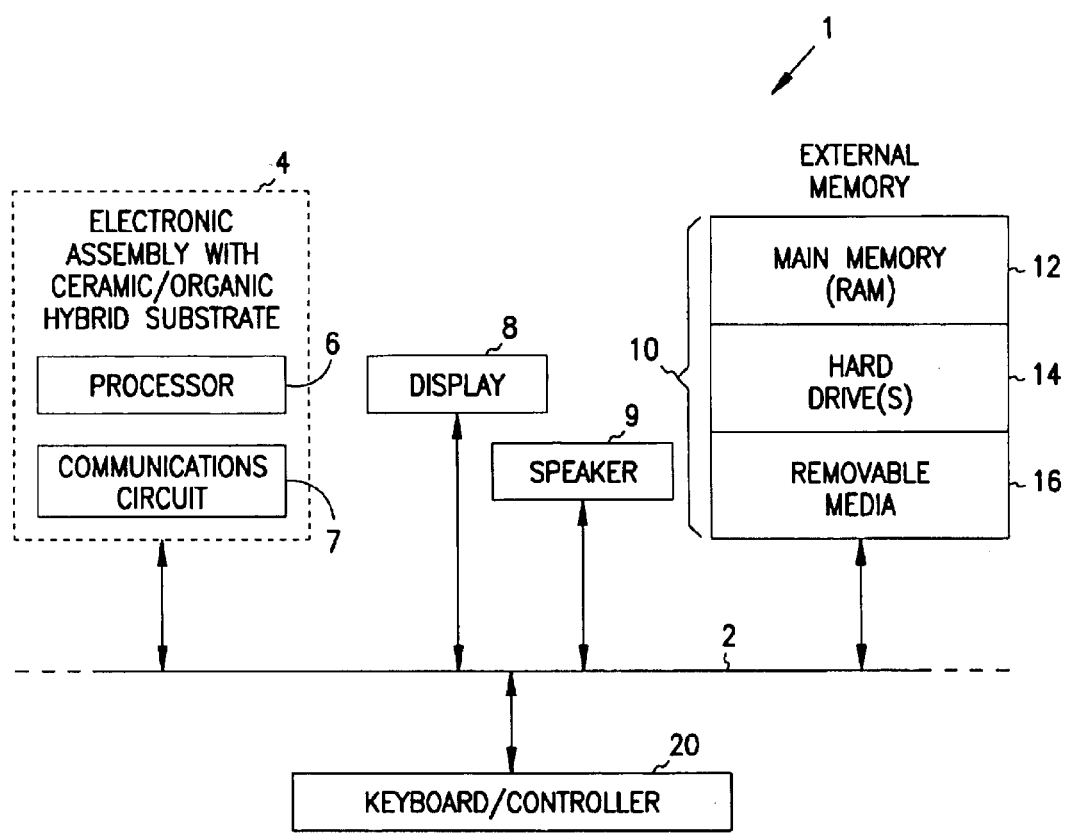
FIG. 1 is a block diagram of an electronic system incorporating at least one electronic assembly with embedded capacitors accordance with one embodiment of the subject matter.

FIG. 1 is a block diagram of an electronic system 1 incorporating at least one electronic assembly 4 with embedded capacitors in accordance with one embodiment of the subject matter. Electronic system 1 is merely one example of an electronic system in which the present subject matter can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, voice-recognition device, or any other device that permits a system user to input information into and/or receive information from the electronic system 1.

Figure 2:
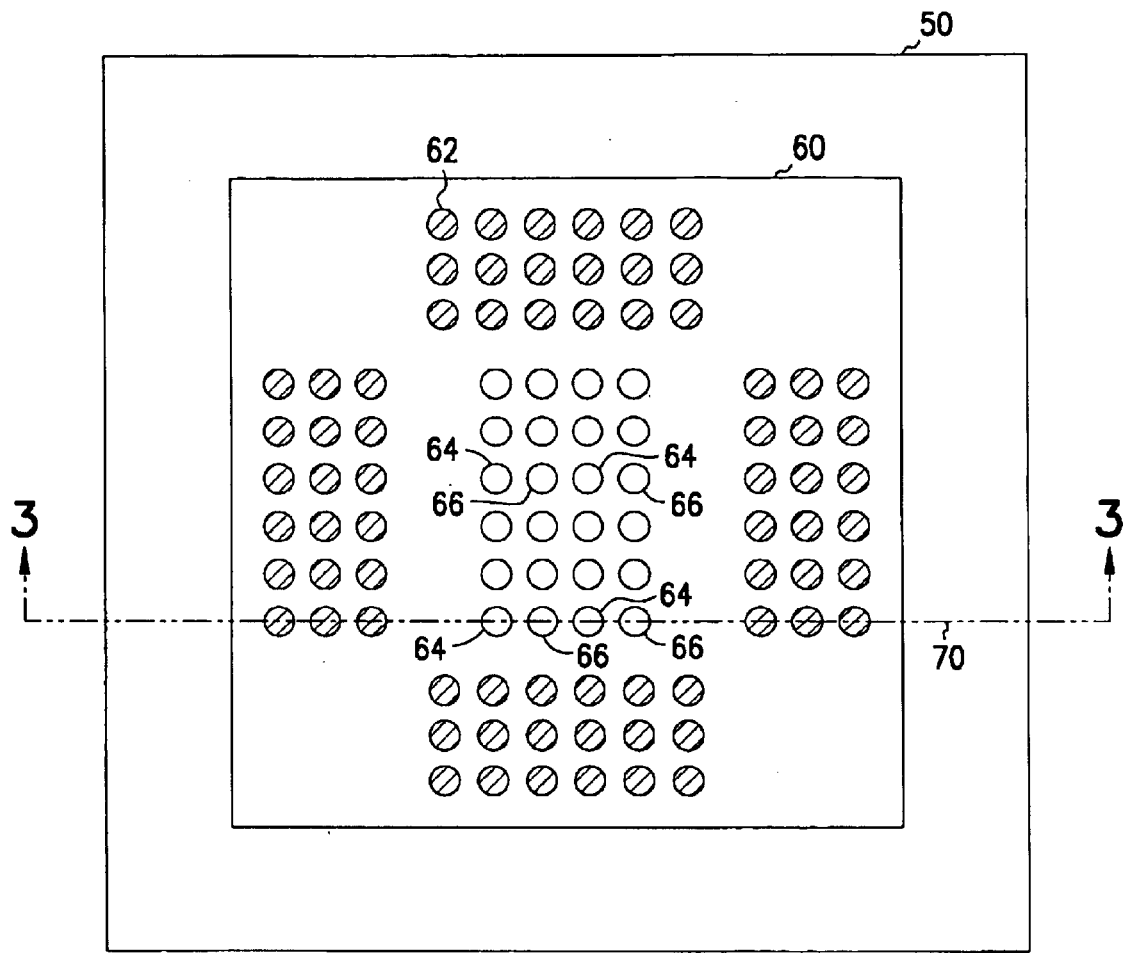
FIG. 2 illustrates a top-view of a die on a substrate.

FIG. 2 illustrates a top-view of a die 60 on a substrate 50, in accordance with one embodiment of the subject matter. This die/substrate structure can form part of electronic assembly 4 shown in FIG. 1. Die 60 can of any type. In one embodiment, die 60 is a processor.

In FIG. 2, die 60 comprises a plurality of signal conductors (not shown) that terminate in lands on the bottom surface of die 60 (not shown). These lands can be coupled to corresponding lands or signal nodes (not shown) on substrate 50 by appropriate connections such as solder bumps or solder balls 62. Solder balls 62 are typically arranged in rows around the periphery of die 60. In FIG. 2 we are looking through die 62 at the solder balls on the bottom surface of die 60. The shaded balls represent signal nodes. The clear balls represent power supply nodes. As used herein, the term "power supply node" refers to either a ground node (e.g. Vss) or to a power node at a potential different from ground (e.g. Vcc).

Still referring to FIG. 2, die 60 also includes, in addition to signal conductors, a plurality of power and ground conductors (not shown) that terminate on lands on the bottom surface in the central core of die 60 (not shown). These lands can be coupled to corresponding lands (not shown) on substrate 50 by appropriate connections such as solder balls 64 and 66. For example, solder balls 64 can be coupled to Vcc potential, and solder balls 66 can be coupled to Vss potential.

While an embodiment is shown in which signal traces are provided around the periphery and Vcc and Vss traces are provided at the die core, the subject matter is equally applicable to embodiments where signal traces occur other than at the periphery, and to embodiments where Vcc and Vss traces are provided anywhere on the die.

Further, the present subject matter is to be construed as limited to use in C4 packages, and it can be used with any other type of IC package where the herein-described features of the present subject matter pride an advantage.

Figure 3:
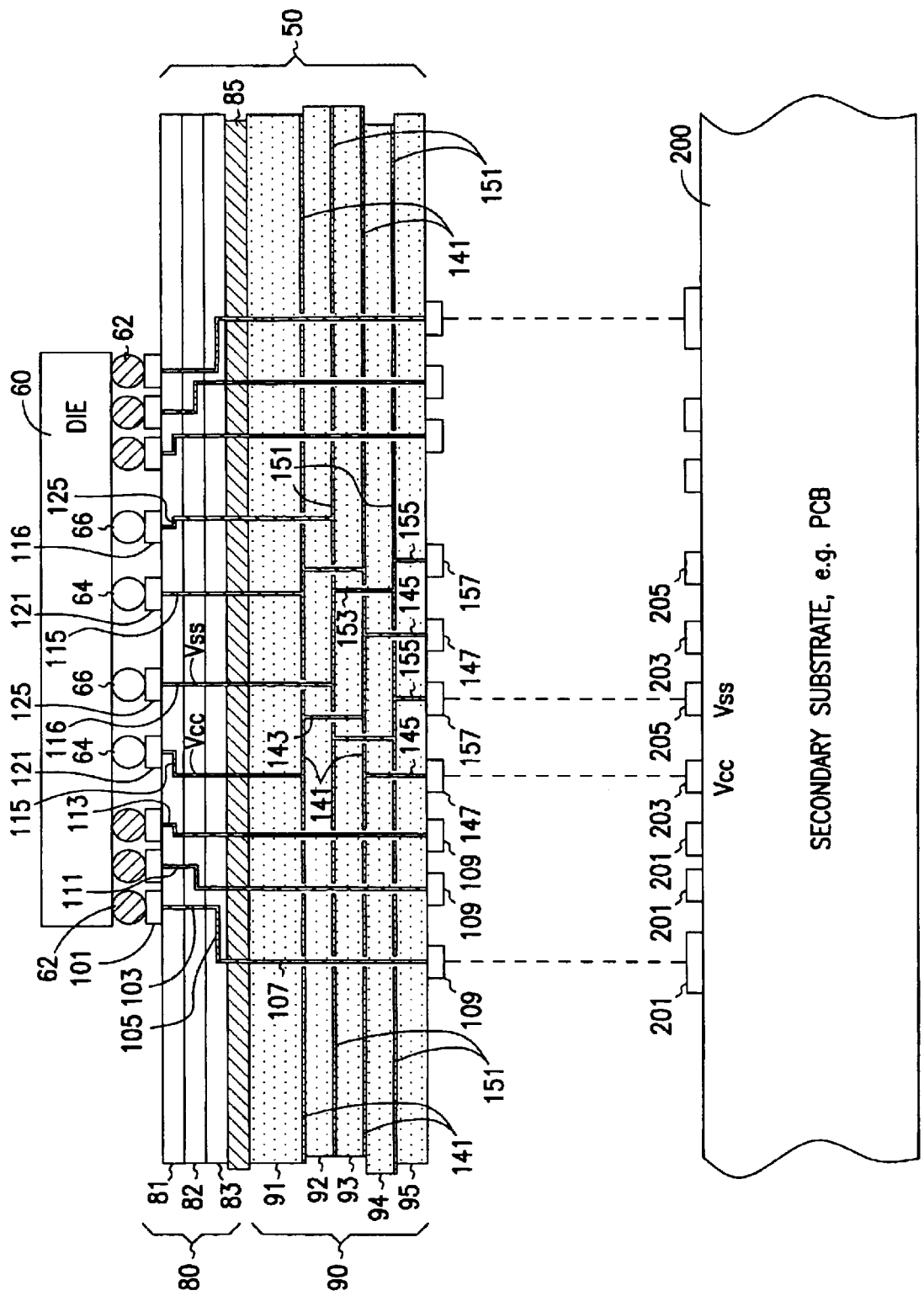
FIG. 3 illustrates a cross-sectional representation of the die/substrate structure of FIG. 2 taken along line 70 of FIG. 2.

FIG. 3 illustrates a cross-section of the die/substrate structure of FIG. 2 taken along line 70 of FIG. 2, in accordance with one embodiment of the subject matter. The multilayer substrate comprises an organic portion 80 and a ceramic portion 90. One important purpose of the subject matter is to provide relatively high capacitance, for example in the form of one or more capacitors embedded in ceramic portion 90, relatively close to the die in order to reduce the effect of reactive inductive coupling when the IC is operating, particularly at high clock speeds.

In one embodiment, organic portion 80 comprises a plurality of organic layers 81–83. Organic portion 80 provides a suitable medium for routing and fanning-out, if desired, conductive traces for I/O signals and/or for power supply potentials such as Vcc and Vss. For example, a signal conductor (not shown) on die 60 can be coupled to solder ball 62, which in turn is coupled to land 101, signal via 103, conductive segment 105, signal via 107, and land 109. Likewise, signal vias 111 and 113 extend from signal conductors on die 60 through appropriate conductive paths to their own respective lands 109 on the bottom surface of substrate 50. In similar fashion, signal vias on the right-hand side of die 60 (as viewed in FIG. 3) are routed and fanned-out from signal conductors (not shown) on die 60 to corresponding lands on the bottom surface of substrate 50.

Lands 109, 147, and 157 on the bottom surface of substrate 50 can be coupled through suitable connectors (not shown), such as solder balls, to corresponding nodes or lands 201, 203, and 205 of a substrate 200 that is subjacent to substrate 50. The subjacent substrate 200 can be similar or identical to substrate 50, or it can be a printed circuit board (PCB) or card, or other type of substrate.

The pitch of various conductors, whether signal or power supply conductors, can optionally be increased, if desired, within the organic portion 80 from a relatively close die bump pitch on the upper surface of substrate 50 to a greater pitch of the signal and/or power supply lands on the bottom surface of substrate 50. Fan-out of signal conductors can aid in decreasing undesirable I/O capacitive coupling between signal conductors, particularly if they run through relatively thick embedded capacitors in ceramic portion 90 comprising relatively thick ceramic ply. However, fan-out of the signal conductors may not be necessary if they run through relatively thin embedded capacitors comprising only a few layers of thin, high Dk ceramic sheets (e.g. 10 microns or less) and/or of high Dk thin film (e.g. 1 micron or less).

Ceramic portion 90, in one embodiment, comprises a plurality of ceramic layers 91–95. Embedded within ceramic layers 91–95, a single capacitor sake of simplicity of illustration and description, that includes a first pair of connected plates 141 at Vcc potential and a second pair of connected plates 151 at Vss potential. Between the plates 141 and 151 is an insulating layer of a high permittivity material.

Ceramic portion 90 provides a suitable medium for providing one or more high value capacitors having first and second terminals that are coupled to Vcc and Vss conductors, respectively, in the core of die 60. For example, a Vcc conductor (not shown) on die 60 can be coupled to each solder ball 64. Each of solder balls 64 is coupled to a land 147 on the bottom surface of substrate 50 by a circuit that includes land 121, Vcc via 115, conductive plates 141 joined by via 143, and Vcc via 145. Likewise, a Vss conductor (not shown) on die 60 can be coupled to each solder ball 66. Each of solder balls 66 is coupled to a land 157 on the bottom surface of substrate 50 by a circuit that includes land 125, Vss via 116, conductive plates 151 joined by via 153, and Vss via 155.

Substrate 50 can include one or more reference planes, such as reference plane 85, comprising a conductive layer of material. In one embodiment, reference plane 85 is fabricated as an upper layer of ceramic portion 90; however, it could alternatively be fabricated as part of organic portion 80.

Substrate 50 can include multiple Vcc, Vss, and signal conductors, only a few of which are illustrated for the sake of simplicity.

As mentioned above, in one embodiment, the embedded capacitors each comprise a pair of capacitive plates, with high permittivity (Dk) layers between the capacitive plates. A first terminal is coupled to one plate, and a second terminal is coupled to the other plate. A "terminal" can either be the plate itself or a trace coupled to the plate.

A first pair of capacitive plates (e.g. plates 141) of one capacitor can be coupled to a Vcc terminal (not shown) on die 60 by way of solder ball 64 as well as to a Vcc terminal 147 on the lower surface of substrate 50. Likewise, a second pair of capacitive plates (e.g. plates 151) of the capacitor can be coupled to a Vss terminal (not shown) on die 60 by way of solder ball 66 as well as to a Vss terminal 157 on the lower surface of substrate 50.

In other embodiments, ceramic portion 90 of substrate 50 can include one or more embedded capacitors each having only two plates or having more than two connected plates per polarity. Moreover, within one substrate, capacitors having different numbers of connected plates per polarity could also be used. For example, within one substrate one capacitor could have only one plate of each polarity, and another capacitor could have three connected plates per polarity.

The particular geometry of the embedded capacitors is very flexible in terms of the orientation, size, number, location, composition of their constituent elements. One or more discrete capacitors could be used instead of the capacitive structure illustrated in FIG. 3. Reference may be made to Related Applications 1 and 2 above for further details on the structure and composition of the embedded capacitors.

The expression "high permittivity layer" as used herein means a layer of high permittivity material such as a high permittivity ceramic ply such as titanate particles; a high permittivity dielectric film such as a titanate film that is deposited, for example, by Sol-Gel or metal-organic chemical vapor deposition (MOCVD) techniques; or a layer of any other type of high permittivity material. Substrate 50 can be provided with one or more embedded capacitors of any suitable type.

Die 60 can comprise a relatively large number of Vss and Vcc die bumps distributed in the core regions of the die 60. This large parallel connectivity ensures very low inductance (e.g. <1 pico-Henry) and enhances the current carrying ability of the overall IC packaging structure.

Various embodiments of organic/ceramic hybrid substrate 50 can be implemented using known organic and ceramic substrate technology to fabricate the constituent structural elements. The structure, including types of materials used, dimensions, number of layers, layout of power and signal conductors, and so forth, of substrate 50 can be built in a wide variety of embodiments, depending upon the requirements of the electronic assembly of which it forms a part.

Substrate 50 can be coupled to an additional packaging element through the lands on its lower surface, such as lands 109, 147, and 157. The additional packaging element can be any suitable device, such a secondary substrate 200 that is identical to, similar to, or different from substrate 50. Substrate 200 could be, for example, a printed circuit board (PCB) or card, a mother board, or any other type of packaging element.

In FIG. 3, the conductive plates 141 and 151 comprise conductive layers formed at the boundary between adjoining insulating layers ceramic material. For example, a first pair of conductive plates 141 are formed between ceramic layers 91/92 and 93/94, and a second pair of conductive plates 151 are formed between ceramic layers 92/93 and 94/95. The first pair of conductive plates 141 are joined by via 143, and they are coupled to Vcc. The second pair of conductive plates 151 joined by via 153, and they coupled to Vss. Conductive plates 141 and 151 can extend, if desired, throughout substantially the entire region between adjoining layers of ceramic material.

Still referring to FIG. 3, via 143 that electrically couples conductive layers or plates 141 will be seen to penetrate and pass through an adjacent one of the second pair of conductive plates 151 without electrically contacting same. Similarly, via 153 that electrically couples conductive layers or plates 151 will be seen to penetrate an adjacent one of the first pair of conductive plates 141 without electrically contacting it.

With further reference to an embodiment shown in FIG. 3, via 143 is perpendicular to and has a geometrical projection upon either or both of the first pair of conductive layers or plates 141. This geometrical projection of via 143 is surrounded by the corresponding conductive plate 141. That is, the conductive plate extends in every direction form the location where the via 143 contacts the plate 141. Similarly, via 153 is perpendicular to and has a geometrical projection upon either or both of the second pair of conductive layers or plates 151. This geometrical projection of via 153 is surrounded by the corresponding conductive plate 151.

Figure 4:
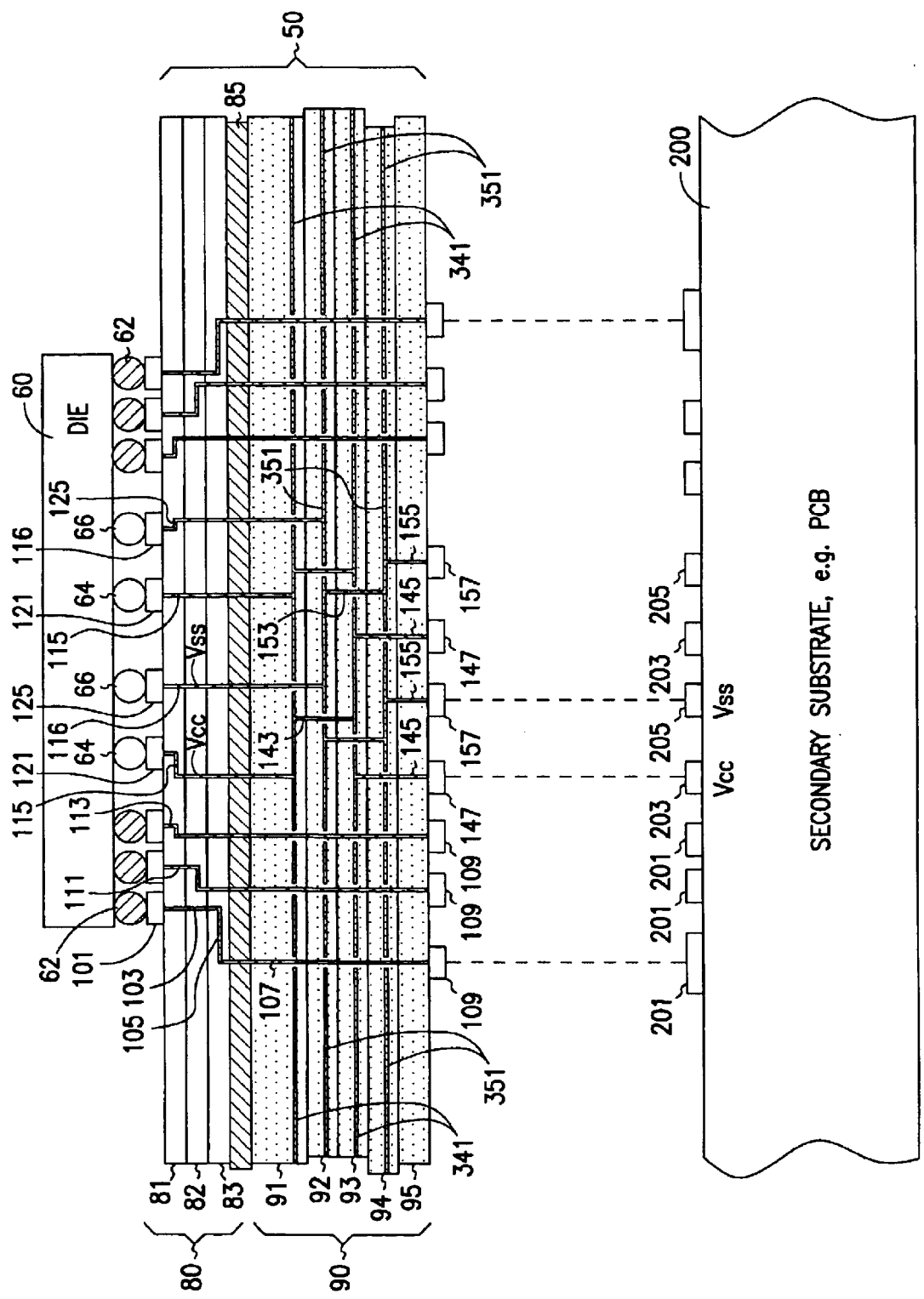
FIG. 4 illustrates a cross-sectional representation of the die/substrate structure of FIG. 2 taken along line 70 of FIG. 2, in accordance with an alternative embodiment.

FIG. 4 illustrates a cross-sectional representation of the die/substrate of FIG. 2 taken along line 70 of FIG. 2, in accordance with an alternative embodiment. In this embodiment, conductive plates 341 and 351 comprise conductive layers formed within the layers of ceramic material. For example, a first pair of conductive plates 341 are formed within ceramic layers 91 and 93, and a second pair of conductive plates 351 are formed within ceramic layers 92 and 94. The conductive layers can be formed, for example, within the layers of ceramic material when the ceramic layers are being built up.

The first pair of conductive plates 341 are joined by via 143, and they are coupled to Vcc. The second pair of conductive plates 351 are joined by via 153, and they are coupled to Vss. Conductive plates 341 and 351 can extend, if desired, throughout substantially the entire region between adjoining layers of ceramic material. The structure of the substrate illustrated in FIG. 4, and the fabrication thereof, can be carried out with any or all of the variations mentioned above regarding the embodiment illustrated in FIG. 3.

FIGS. 2–4 are merely representational and are not drawn to scale. Certain proportions thereof may be exaggerated, while others may be minimized. FIGS. 2–4 are intended to illustrate various implementations of the subject matter that can be understood and appropriately carried out by those of ordinary skill in the art.

Fabrication

The organic portion 80 of substrate 50 (FIG. 3) can be fabricated by conventional techniques, such as but not limited to conventional organic build-up techniques. For example, dielectric layers 81–83 can be fabricated from materials such as epoxies, acrylates, polyimides, polyurethanes, polysulfides, resin-glass weave (e.g. FR-4), nylons, and other similar materials. The layers can be constructed using familiar equipment for extruding, coating, spinning on, spraying, screen-printing, stenciling, and doctor-blading. Coating equipment such as a meniscus coater or curtain coater could be used.

Ceramic portion 90 of substrate 50 can be fabricated by conventional techniques, such as but not limited to high temperature co-fired ceramic (HTCC) technology, high thermal coefficient of expansion (HITCE) technology, or glass ceramic technology.

To ensure low equivalent series resistance (ESR) values, a low temperature silver or copper compatible co-fired ceramic technology may be used. The resulting thin ceramic sheets have a typical thickness of below 10 microns and a Dk value in the range of 2000–5000.

Multilayer stacks of high Dk ply be used in ceramic portion 50. High Dk ply is commercially available for fabricating ceramic chip capacitors, for example. Suitable high Dk materials, such as titanate particle can be inserted into the conventional ceramic matrix. Multilayer stacks of high Dk ply, such as $BaTiO_3$, in the present subject matter can provide capacitances as high 10 $\mu F$/sq. cm.

In an alternative embodiment, layers of high Dk film, such as a titanate film, e.g. $(Ba_xT_{1-x})TiO_3$ (BST) or $PbZrTiO_3$ (PZT) or $Ta_2 O_5$ or $SrTiO_3$, can be formed in the ceramic portion 50 by known techniques such as a metal-organic chemical vapor deposition (MOCVD) process, or a Sol-Gel process, in which a sol, which is a colloidal suspension of solid particles in a liquid, transforms into a gel due to growth and interconnection of the solid particles.

In either case, high Dk material can be embedded at temperature ranges that are compatible with ceramic technology (e.g. 600–1000 degrees Centigrade).

Metal traces and vias can be formed in organic portion 80 and/or ceramic portion 90 using additive or subtractive techniques that are well known to those of ordinary skill in the art. For example, vias can be punched through each layer prior to stacking, and they can then be filled with metal paste prior to ceramic firing.

Figure 5:
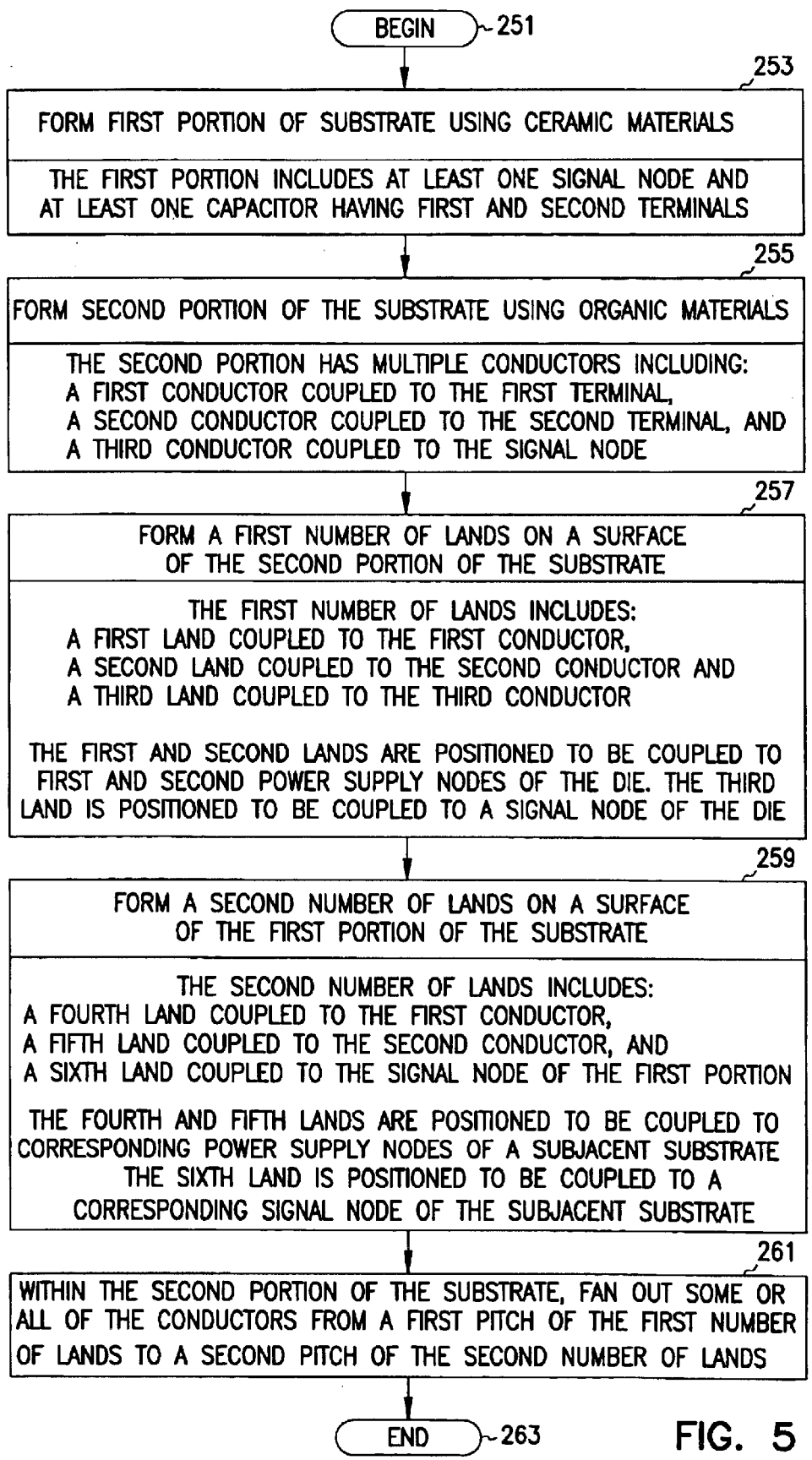
FIG. 5 is a flow diagram of a method of fabricating a substrate to package a die, in accordance with one embodiment of the subject matter.

FIG. 5 is a flow diagram of a method of fabricating a substrate to package a die, in accordance with one embodiment the subject matter. According to this method, a ceramic/organic hybrid substrate at least one embedded capacitor is fabricated. The method begins at 251.

In 253, a first portion 90 (FIG. 3) of the substrate is formed using ceramic materials. The first portion includes at least one signal node, such as signal conductor 107 (FIG. 3). The first portion also includes at least one capacitor having a first terminal, such as conductive plate 141, and a second terminal, such as conductive plate 151 (FIG. 3).

In 255, a second portion 80 (FIG. 3) of the substrate is formed using organic materials. The second portion has multiple conductors, such as vias 103, 111, 113, 115, and 116 (FIG. 3). The conductors include a first conductor, such as via 115 (FIG. 3), that is coupled to the first terminal of the capacitor. The conductors also include a second conductor, such as via 116 (FIG. 3), that is coupled to the second terminal of the capacitor. The conductors further include a third conductor, such as via 103 (FIG. 3), that is coupled to the signal node 107 (FIG. 3) within the first portion 90 (FIG. 3) of the substrate.

In 257, a first number of lands, such as lands 101, 121, and 125 (FIG. 3), are formed on a surface of the second portion 80 (FIG. 3) of the substrate. The lands include a first land, such as land 121, coupled to the first conductor 115 (FIG. 3); a second land, such as land 125, coupled to the second conductor 116 (FIG. 3); and a third land, such as 101, coupled to the third conductor 107 (FIG. 3).

Still with regard to 257 in FIG. 4, the first land 121 (FIG. 3) is positioned to be coupled to a first power supply node (e.g. Vcc) of a die 60 (FIG. 3) that is to be juxtaposed to the upper surface of the substrate 50 and physically affixed thereto. The second land 125 (FIG. 3) is positioned to be coupled to a second power supply node (e.g. Vss) of die 60 (FIG. 3). The third land 101 (FIG. 3) is positioned to be coupled to a signal node of die 60 (FIG. 3).

In 259, a second number of lands, such as lands 109, 147, and 157 (FIG. 3), are formed on a surface of the first portion 90 (FIG. 3) of the substrate. The lands include a fourth land, such as land 147, coupled to the first terminal 141 (FIG. 3); a fifth land, such as land 157, coupled to the second terminal 151 (FIG. 3); and a sixth land, such as 109, coupled to the signal node 107 of the first portion 90 (FIG. 3).

Still with regard to 259 in FIG. 4, the fourth land 147 (FIG. 3) is positioned to be coupled to a first power supply node 203 (e.g. Vcc) of a subjacent substrate 200 (FIG. 3). The fifth land 157 (FIG. 3) is positioned to be coupled to a second power supply node 205 (e.g. Vss) of subjacent substrate 200 (FIG. 3). The sixth land 109 (FIG. 3) is positioned to be coupled to a signal node 201 of subjacent substrate 200 (FIG. 3).

In 261, some or all of the conductors of the second portion 80 (FIG. 3) are fanned out from a first, relatively tight pitch of the first number of lands (e.g. lands 101, 121, 125) to a second, relatively relaxed pitch of the second number of lands (e.g. lands 109, 147, 157). This fan-out is fabricated primarily within second portion 80 of substrate 50. However, fan-out is not necessarily limited to second portion 80, and some fan-out could also be performed within first portion 90 of substrate 50. The method ends at 263.

The operations described above with respect to the methods illustrated in FIG. 5 can be performed in a different order from those described herein. For example, it will be understood by those of ordinary skill that 261 will preferably be carried out during the fabrication of second portion 80 in 255. Also, 259 could be carried out during the fabrication of the first portion 90 in 253.

Conclusion

The present subject matter provides for an electronic assembly and methods of manufacture thereof that minimize problems, such as switching noise, associated with high clock frequencies and high power delivery. The present subject matter provides scalable high capacitance (e.g. >10 mF/square centimeter) by employing one or more embedded decoupling capacitors having low inductance which can satisfy the power delivery requirements of, for example, high performance processors. By using a thin organic portion for conductor routing, the ceramic portion that comprises the decoupling capacitors can be positioned relatively close to the IC die, thus minimizing the inductance. The ceramic portion lends itself well to the fabrication of high valued embedded capacitors and also provides requisite stiffening to the package to prevent warpage. An electronic system that incorporate the present subject matter can operate reliably at higher clock frequencies and is therefore more commercially attractive.

As shown herein, the present subject matter can be implemented in a number of different embodiments, including a substrate, an electronic assembly, an electronic system, a data processing system, and methods for making a substrate. Other embodiments will be readily apparent to those of ordinary skill in the art. The elements materials, geometries, and dimensions call all be varied to suit particular packaging requirements.

Although specific embodiments have been illustrated and described herein, any arrangement which is calculated to achieve the same purpose may be substituted for the specific embodiments shown. This application is intended to cover any adaptations or variations of the present subject matter. Therefore, it is manifestly intended that embodiments of this subject matter be limited only by the claims and the equivalents thereof.

What is claimed is:

1. A multilayer substrate to mount a die comprising:
   a ceramic portion comprising an embedded capacitor having first and second terminals;
   a first plurality of lands on a first surface thereof, including a first land coupled to the first terminal and a second land coupled to the second terminal, wherein the first and second lands are positioned to couple to corresponding power supply nodes of the die; and
   an organic portion comprising a plurality of conductors, including a first conductor coupling the first land to the first terminal and a second conductor coupling the second land to the second terminal.

2. The multilayer substrate recited in claim 1 and further comprising a second plurality of lands on a second surface thereof, including a third land coupled to the first terminal and a fourth land coupled to the second terminal.

3. The multilayer substrate recited in claim 2, wherein the pitch of the second plurality of lands is greater than the pitch of the first plurality of lands, and wherein the pitch is increased within the organic portion.

4. The multilayer substrate recited in claim 2, wherein the first plurality of lands further comprises a fifth land positioned to couple to a corresponding signal node of the die, and wherein the second plurality of lands comprises a sixth land coupled to the fifth land via a conductive path that comprises one of the plurality of conductors.

5. The multilayer substrate recited in claim 4, wherein the pitch of the second plurality of lands is greater than the pitch of the first plurality of lands, and wherein the pitch is increased within the organic portion.

6. The multilayer substrate recited in claim 2, wherein the third and fourth lands are positioned to couple to corresponding power supply nodes of an additional substrate underlying the multilayer substrate.

7. The multilayer substrate recited in claim 1, wherein the capacitor comprises at least one high permittivity layer.

8. The multilayer substrate recited in claim 1, wherein the capacitor comprises a plurality of high permittivity layers.

9. The multilayer substrate recited in claim 8, wherein the capacitor comprises a plurality of conductive layers interleaved with the high permittivity layers, such that alternating conductive layers are coupled to the first and second lands, respectively.

10. The multilayer substrate recited in claim 1, wherein the organic portion comprises a plurality of layers, each comprising a portion of the plurality of conductors.

11. A method for making a substrate to package a die, the method comprising:
   forming a first portion of the substrate using ceramic materials, the first portion comprising an upper surface and a lower surface and including at least one capacitor between the upper and lower surfaces, the at least one capacitor having first and second terminals;
   forming a second portion of the substrate using organic materials, the second portion comprising a plurality of conductors therein, including a first conductor coupled to the first terminal and a second conductor coupled to the second terminal, the second portion overlying the first portion; and
   forming a first plurality of lands on a surface of the second portion of the substrate, including a first land coupled to the first conductor, and a second land coupled to the second conductor, wherein the first and second lands are positioned to couple to first and second power supply nodes of the die.

12. The method recited in claim 11, wherein forming the first portion comprises forming a first signal node, wherein forming the second portion comprises forming a third conductor coupled to the first signal node, and wherein forming the first plurality of lands comprises forming a third land coupled to the third conductor, the third land being positioned to couple to a signal node of the die.

13. The method recited in claim 11 and further comprising:
   forming a second plurality of lands on the lower surface of the first portion of the substrate, including a third land coupled to the first terminal, and a fourth land coupled to the second terminal, and wherein forming the second portion comprises fanning out the plurality of conductors from a first pitch of the first plurality of lands to a second pitch of the second plurality of lands.

14. A multilayer substrate to mount a die comprising:
   a ceramic portion comprising an upper surface and a lower surface and including a capacitor located between the upper and lower surfaces, the capacitor having first and second terminals; and an organic portion comprising an upper surface having a first plurality of lands thereon, including a first land coupled to the first terminal and a second land coupled to the second terminal, wherein the first and second lands are positioned to couple to corresponding power supply nodes of the die, the organic portion further including a plurality of conductors, including a first conductor coupling the first land to the first terminal and a second conductor coupling the second land to the second terminal.

15. The multilayer substrate recited in claim 14 and further comprising a second plurality of lands on the lower surface of the ceramic portion, including a third land coupled to the first terminal and a fourth land coupled to the second terminal.

16. The multilayer substrate recited in claim 15, wherein the pitch of the second plurality of lands is greater than the pitch of the first plurality of lands, and wherein the pitch is increased within the organic portion.

17. The multilayer substrate recited in claim 15, wherein the first plurality of lands further comprises a fifth land positioned to couple to a corresponding signal node of the die, and wherein the second plurality of lands comprises a sixth land coupled to the fifth land via a conductive path that comprises one of the plurality of conductors.

18. The multilayer substrate recited in claim 17, wherein the pitch of the second plurality of lands is greater than the pitch of the first plurality of lands, and wherein the pitch is increased within the organic portion.

19. The multilayer substrate recited in claim 15, wherein the third and fourth lands are positioned to couple to corresponding power supply nodes of an additional substrate underlying the ceramic portion.

20. The multilayer substrate recited in claim 14, wherein the capacitor comprises at least one high permittivity layer.

21. The multilayer substrate recited in claim 14, wherein the capacitor comprises a plurality of high permittivity layers.

22. The multilayer substrate recited in claim 21, wherein the capacitor comprises a plurality of conductive layers interleaved with the high permittivity layers, such that alternating conductive layers are coupled to the first and second lands, respectively.

23. The multilayer substrate recited in claim 14, wherein the organic portion comprises a plurality of layers, each comprising a portion of the plurality of conductors.

24. A multilayer substrate to mount a die comprising:

a ceramic portion comprising an upper surface and a lower surface and including a capacitor located between the upper and lower surfaces, the capacitor including a plurality of conductive layers interleaved with insulating layers, the plurality of conductive layers comprising a first plurality of conductive layers to be at a first potential and a second plurality of conductive layers to be at a second potential, wherein selected ones of the first plurality of conductive layers are electrically coupled to at least a first via that penetrates an adjacent one of the second plurality of conductive layers without electrically contacting same, wherein selected ones of the second plurality of conductive layers are electrically coupled to at least a second via that penetrates an adjacent one of the first plurality of conductive layers without electrically contacting same, wherein the capacitor includes a first terminal electrically coupled to the first via, and wherein the capacitor includes a second terminal electrically coupled to the second via; and an organic portion comprising an upper surface having a first plurality of lands thereon, including a first land coupled to the first terminal and a second land coupled to the second terminal, wherein the first and second lands are positioned to couple to corresponding power supply nodes of the die, the organic portion further including a plurality of conductors, including a first conductor coupling the first land to the first terminal and a second conductor coupling the second land to the second terminal.

25. The multilayer substrate recited in claim 24, wherein the first via has a projection upon a selected one of the first plurality of conductive layers that is surrounded by the selected one of the first plurality of conductive layers.

26. The multilayer substrate recited in claim 25, wherein the second via has a projection upon a selected one of the second plurality of conductive layers that is surrounded by the selected one of the second plurality of conductive layers.

27. The multilayer substrate recited in claim 24, wherein the insulating layers comprise high permittivity material.

28. The multilayer substrate recited in claim 24, wherein the organic portion comprises a plurality of layers, each comprising a portion of the plurality of conductors.

29. The multilayer substrate recited in claim 24 and further comprising a second plurality of lands on the lower surface of the ceramic portion, including a third land coupled to the first terminal and a fourth land coupled to the second terminal.

30. The multilayer substrate recited in claim 29, wherein the pitch of the second plurality of lands is greater than the pitch of the first plurality of lands, and wherein the pitch is increased within the organic portion.

31. The multilayer substrate recited in claim 29, wherein the first plurality of lands further comprises a fifth land positioned to couple to a corresponding signal node of the die, and wherein the second plurality of lands comprises a sixth land coupled to the fifth land via a conductive path that comprises one of the plurality of conductors.

32. The multilayer substrate recited in claim 31, wherein the pitch of the second plurality of lands is greater than the pitch of the first plurality of lands, and wherein the pitch is increased within the organic portion.

33. The multilayer substrate recited in claim 29, wherein the third and fourth lands are positioned to couple to corresponding power supply nodes of an additional substrate underlying the ceramic portion.

* * * * *